July 31, 1962 R. F. RUTZ 3,047,733

MULTIPLE OUTPUT SEMICONDUCTOR LOGICAL DEVICE

Original Filed May 25, 1955 2 Sheets-Sheet 1

INVENTOR.
RICHARD F. RUTZ

BY Alvin J. Riddles
AGENT

INVENTOR.
RICHARD F. RUTZ
BY
Alvin J. Riddles
AGENT 3,047,733
MULTIPLE OUTPUT SEMICONDUCTOR LOGICAL DEVICE Richard F. Rutz, Fishkill, N.Y., assignor to International Business Machines Corporation, New York, N.Y., a corporation of New York Continuation of application Ser. No. 511,047, May 25, 1955. This application Mar. 12, 1957, Ser. No. 645,627
23 Claims. (Cl. 307—88.5)

This invention relates to transistors and more particularly to transistors having multiple collector electrodes as described in the copending United States application No. 511,047 filed May 25, 1955, now abandoned, to which this application is related as a continuation.

It has been discovered that if a transistor is provided with a large emitting area, more than one high current amplification factor (known as alpha) collecting region and structural geometry such that an internal positive feedback between emitter and collector can be set up inside the transistor crystal, the switching of an output signal from one collector to an adjacent one can be accomplished merely by driving the conducting collector beyond saturation and this switching shuts off the conducting collector. This discovery gives rise to a structural principle in semi-conductor device manufacture whereby transistors may be constructed that will direct the output current to a different output electrode for each increment of input current.

Accordingly, it is a principal object of this invention to provide a transistor structural principle whereby output signals may be directed to different electrodes by increasing the input current Another object is to provide a single transistor employing the structural principle of this invention that is capable of logical circuit functions.

Another object is to provide a single transistor full binary adder.

Another object is to provide a single transistor counter.

Another object is to provide a single transistor memory circuit.

A related object is to provide a single transistor capable of logical circuit functions having an output wave shape adaptable to checking operations.

Other objects of the invention will be pointed out in the following description and claims and illustrated in the accompanying drawings, which disclose, by way of example, the principle of the invention and the best mode, which has been contemplated, of applying that principle.

Figure 1:
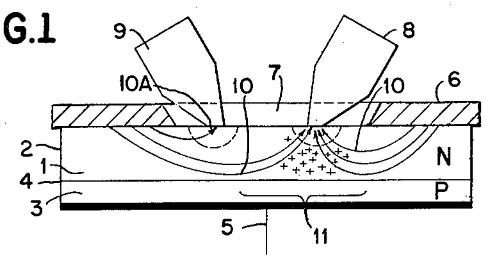
FIGURE 1 is one embodiment of the structural principle of this invention illustrating the electric fields set up inside the crystal.

Referring now to FIGURE 1 there is shown an illustration of a transistor embodying the structural principle of this invention. The transistor comprises a semi-conductor crystal 1 having zones 2 and 3 of opposite type conductivity separated by a junction barrier 4. The zone of semi-conductor material 2 shown in this illustration as N type conductivity serves as the body of the transistor and has a thickness within the average diffusion distance for excess carriers during the carrier lifetime. Excess carriers are defined as the excess over the equilibrium of the majority to minority carriers in the crystal. An ohmic contact 5 is provided covering substantially all of the exposed surfaces of the P type region 3. The thickness of the P type region 3 is sufficiently small that with the ohmic contact 5 applied to nearly all of the exposed surface, this zone 3 is essentially unipotential throughout. The ratio of resistivities of the N to P regions for good minority carrier injection efficiency is preferably of the ratio of at least five to one with comparable lifetime in the two regions. The unipotential P type zone 3 forms a junction barrier 4 with the N type zone 2 and serves as a broad area emitter for the transistor. An ohmic contact 6 is provided covering the surface of the N type region 2. The contact 6 has an aperture 7 wherein the surface of the N type region is exposed. Two electroformed point contact collectors 8 and 9 having high intrinsic alpha (greater than $1+b$ where $b$ is the ratio of mobilities of electrons to holes) are provided making contact with the N type region 2 inside the aperture 7 in the base contact 6. The lines of electron current flow when collector 8 is conducting are shown symbolically as arrows 10 and hole current flow is shown symbolically as + signs emanating from a restricted part of the junction 4 labelled as region 11.

The transistor design above described has incorporated within it certain desirable features such as: high gain achieved through the use of the combination of a high alpha electroformed point contact collector and a high minority carrier injection efficiency junction emitter; high power handling capabilities due to the large area of the emitter both for minority carrier injection and the attaching of a heat sink; and high frequency operation permitted by the close spacing of the electrodes and the strong internal electric fields which shorten the transit times of the minority carriers. The various features of this transistor design have been described and claimed in U.S. Patents 2,889,499 and 2,842,668. As may be seen from the power handling ability of the transistor described in these patents, such a transistor may be used to drive heavy loads and active circuit elements directly for example relays.

The distinctive feature of the structural principle of this invention is due to an interaction between the collectors which can be described as a "robbing effect." Essentially, this effect occurs when two high amplification factor collectors connected to a fixed bias are placed in close proximity to each other and to a forwardly biased emitter and it is the geometry of construction of semiconductor devices having multiple collectors wherein the interelectrode proximity is maintained so that intercollector signal switching is possible that constitutes the structural principle of this invention.

What happens is that, as the emitter current increases, conduction first takes place in a first collector to the exclusion of current conduction in the second collector and, as the emitter current continues to increase the conduction changes to the second collector. This is believed to be due to the following, referring to FIGURE 1. As the emitter current increases, holes are injected at the barrier 4 which diffuse through the N region 2 to the collectors 8 and 9. The collector for example, assume collector 8, having the highest initial intrinsic alpha or is otherwise favored so that greater quantities of holes reach it, release greater quantities of electrons which flow to the base 6 setting up an electric field inside the N region 2 which directs and accelerates all the injected holes to the collector 8, in effect depriving the collector 9 of holes which otherwise might go to it and as a result the entire output current from the transistor comes from the favored collector 8.

Figure 2:
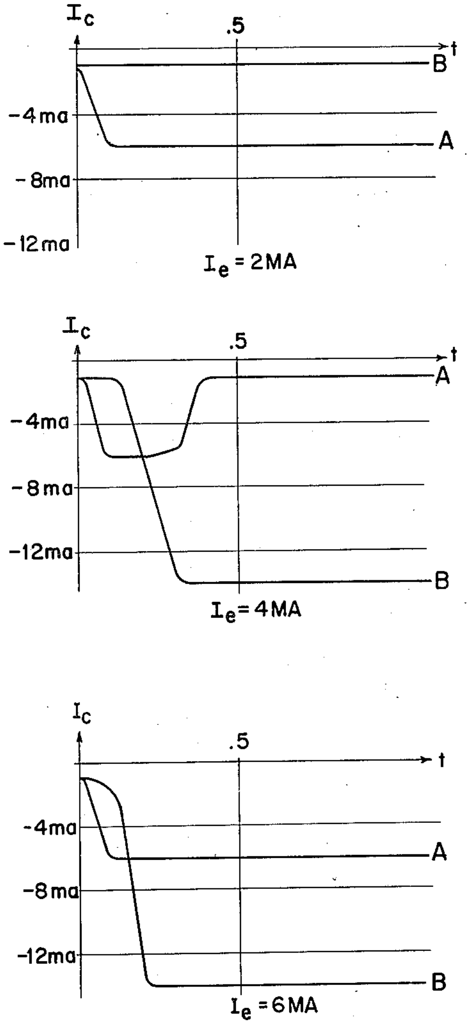
FIGURE 2 is an illustration of the variation of collector current with emitter current for the transistor of FIGURE 1.
Figure 3:
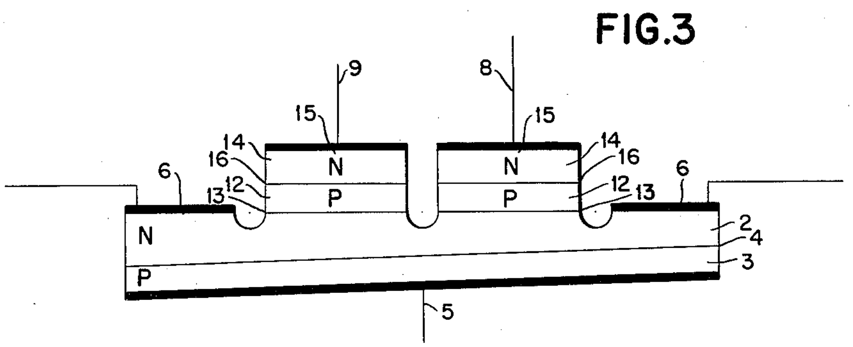
FIGURE 3 is another embodiment of the transisor of FIGURE 1.

The electric field produced as the favored collector 8 conducts causes a concentration of holes in the N region 2 directly under the collector which so lowers the forward resistance of the N region 2 in the region directly under the collector 8 that the injecting portion of the physically large junction barrier 4 is restricted to the portion directly under the collector 8. In FIGURE 1 the lines of electron current flow for the condition where collector 8 is conducting are shown symbolically as arrows 10, the concentration of holes are shown symbolically as + and the injecting portion of the barrier 4 for collector is shown as the region 11. It should be noted that arrow 10A indicates the normal back resistance electron current of the non-conducting collector 9, and that some interaction of the fields of each collector takes place as is indicated by arrows crossing under the second collector. This conduction by collector 8 continues as the emitter current increases until collector 8 becomes voltage saturated which is the point of operation at which the barrier believed to be directly under the collector is saturated with holes and further current cannot lower the base to collector impedance appreciably. At this point further increases in hole current arriving at the collector cannot produce additional electron current flow out of the collector. Further emitter current injects greater quantities of holes which upon arrival at collector 8 will not increase the field in the vicinity of collector 8 but hole current arriving at collector 9 will increase the field directed toward collector 9. This second electric field, as the emitter current continues to increase, becomes so strong as to suppress the effect of the first field redistributes the emission region and switches the entire conduction to the second collector 9. This switching can be thought of as a "robbing effect" in that the second collector in effect "robs" the first collector of the hole current from the emitter that formerly went to it. This switching can be observed by referring to FIGURE 2 which shows the variation of collector current with time for different values of emitter current. Referring now to FIGURE 2 for the value of emitter current $I_e=2$ MA curve A represents the collector current for collector 8 of the transistor in FIGURE 1 and curve B represents the collector current of collector 9. At this value of emitter current all conduction takes place through collector 8 and collector 9 has only its normal back resistance current through it as is indicated by the level of curve B from 0. An increase in emitter current such as is shown by the $I_e=4$ MA value causes conduction to cease at collector 8 as represented by curve A and causes high conduction to be established at collector 9 as represented by curve B. It should be noted that as a larger input emitter current is impressed collector 8 starts to turn on and then the conduction switches to collector 9 generating thereby a precursor pulse at collector 8 before conduction is established at collector 9. This pulse may be used to advantage for redundancy checking purposes in logical circuits to be later described. Since this pulse can be made of short duration with respect to the total input pulse time it can be readily distinguished. As the emitter current is further increased as shown in FIGURE 2 for the condition $I_e=6$ MA collector 9 becomes saturated and the excess carriers have turned on collector 8 also so that both curves A and B indicate high conduction. The above description of the "robbing effect" applies equally to an all junction device employing the structural principle of this invention wherein the high alpha collectors instead of being electroformed point contacts are P-N hook junctions well known in the art. An all junction device illustrating this type of construction is shown in FIGURE 3 wherein each P-N hook junction collector comprises a P type region of controlled thickness forming a junction 13 with the N type region 2, and an N type region 14 having an ohmic collector connection 15 applied to its exposed surface and forming a junction 16 with the controlled thickness P type region 12. The technology of providing the restricted area P-N hook collectors within an aperture 7 in the base tab 6 is involved but it can be readily performed by one skilled in the art.

It should be noted in connection with the all junction structure as illustrated in FIGURE 3 that the emitter junction barrier 3 is non-planar with respect to the hook collector junctions 13. The reason for this is that, as was mentioned above, conduction begins first in one collector that is more favored, by virtue of a higher intrinsic alpha, minority carrier transport efficiency being higher in the crystal under that particular collector or higher injection efficiency of the emitter junction in the region adjacent to that collector. In theory it is possible to provide collectors such that one is not favored but in practice there are so many variables that duplication of collectors will exactly equal characteristics is difficult. Hence, in order to always establish the collector that is to be initially favored and in which the conduction will always start a form of deliberate favoritism is practiced. In the case of point contacts this favoritism may be acquired by heavier electroforming of one particular collector to bring the junction under that collector nearer the emitter and a similar approach is practiced in an all junction device as shown by employing a non-planar emitter junction as shown in FIGURE 3. Here the non-planar junction has the effect of providing a shorter emiter to collector distance for one favored collector. This method of providing favoritism will work equally well with point contact structures and its employment over variable electroforming is a matter of convenience.

Figure 4:
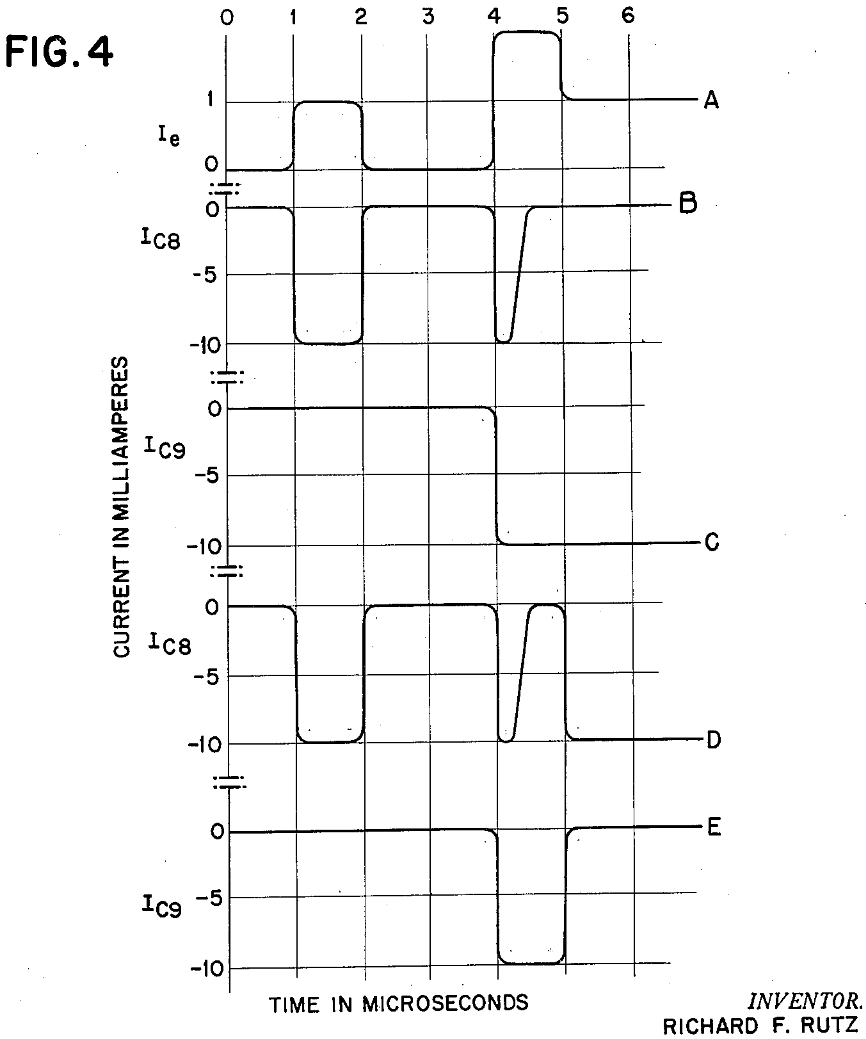
FIGURE 4 is an illustration of the types of variation of collector current with emitter current for the circuit of FIGURE 6.

In the structure of FIGURE 3 the conduction begins in collector 8 as described above since it is favored by the non-planar junction 3 and when the emitter current value exceeds saturation the "robbing effect" takes place switching the conduction to collector 9. When conduction is established in the second collector 9 as a result of an increase in emitter current, a subsequent decrease in emitter current may produce one of two controllable effects. The first of these effects is that once conduction is established in the second collector it will be retained in that collector after the emitter current is reduced, and the second effect is that the conduction will be established at a specific collector for a given value of emitter current. These two effects are illustrated by the curves in FIGURE 4, wherein curve A represents the variation in emitter current with respect to time, curves B and C represent the variations in collector current with respect to time for the effect where, once conduction is established in the second collector it will be retained when the emitter current is reduced and curves D and E represent the variations in collector current with respect to time for the effect where conduction is established in a specific collector for a given value of emitter current. Comparing the curves B and C with variations in A for one effect and D and E with variations in A for the second effect it will be seen that for a given value of emitter current the first collector conducts as shown in curve B and when a greater value of emitter current is provided as shown in curve A, the first collector represented by curve B starts to turn on but as saturation is passed the "robbing effect" takes place the conduction goes to the second collector as shown in curve C and the first collector ceases conduction. At this point a subsequent reduction in emitter current has no effect on which collector is conducting and the second collector continues conducting. This is contrasted with the second effect where in a comparison of curves D and E with curve A for one increment of emitter current the first collector conducts, the second one not conducting. As a greater value of emitter current is applied the first collector represented by curve D begins conduction but as the "robbing effect" takes place conduction is set up in the second collector as represented by curve E. At this point, however, a reduction of emitter current cuts off the second collector and re-establishes conduction in the first collector which in effect permits selection of a specific collector for conduction by control of the magnitude of the emitter current. The above effects also are applicable to point contact structures.

Figure 5:
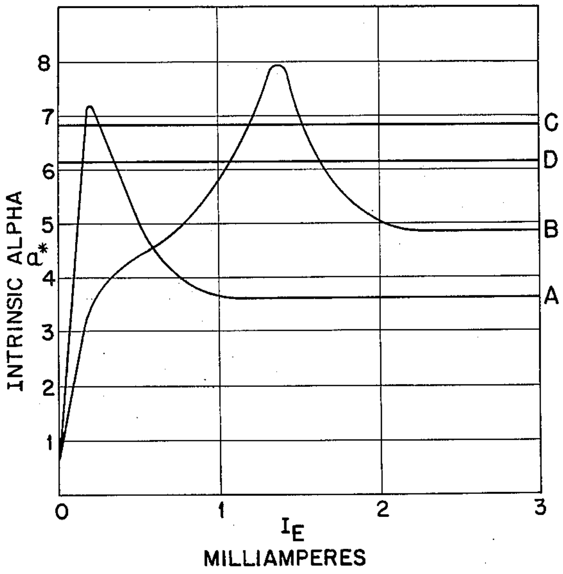
FIGURE 5 is a graph of the variation of amplification factor with emitter current for the various types of collectors of the transistors of FIGURES 1 and 3.

The control over which collector conducts when the emitter current is reduced is exercised in the fabrication of the semi-conductor device or in the selection of circuit values associated with it. In the technology of fabrication of semi-conductor devices by one skilled in the art it is possible to so electroform a point contact collector that the greatest amplification factor of the collector occurs at a selected value of emitter current. An example of such a difference is shown in FIGURE 5 wherein the intrinsic alpha variation with emitter current is shown in curves A and B for two electroformed point contact collectors. In curve A the intrinsic alpha rises sharply to a peak value at low emitter current and then levels off at a reduced value for higher emitter currents whereas in curve B the intrinsic alpha rises more slowly reaching a peak higher than curve A at a value of emitter current much higher than that required for the peak of curve A and subsequently decreasing to a steady state value greater than curve A for higher emitter currents. While the technique of electroformation of point contact collectors is a precise and involved phase of semi-conductor technology the method of proper electroforming to produce collectors exhibiting intrinsic alpha variation with emitter current as shown in curves A and B of FIGURE 5 could readily be performed by one skilled in the art by variation of the length and duration of the electroforming pulse and of the concentration of appropriate impurities in the collector wire.

Similarly, it is possible to produce a variable intrinsic alpha collector for an all junction type of device similar in operation to the embodiment shown in FIGURE 3. The technology of fabrication of such junction collectors is equally as involved as in the case of electroformed point contacts and the production of such P-N hook junctions may be performed in many ways by one skilled in the art, the techniques of alloying, diffusing and gold bonding being examples. A brief insight into the problem for illustration only may be acquired from study of the following mathematical expression for the value of intrinsic alpha of the P-N hook.

$$\alpha^*=1+\frac{\rho_p}{\rho_n}\times\frac{Ln}{W}$$

where $\alpha^*$ is the intrinsic $\alpha$ of the PN hook.
$\rho_p$ is the resistivity of the P region.
$\rho_n$ in the resistivity of the N region.
$Ln$ is the diffusion distance of the average excess minority carrier during the carrier lifetime in the N region.
W is the width of the P region.

The above expression is included for illustration only since a given expression does not hold for all ranges of resistivities of the semi-conductor material. This expression for accuracy is limited to the region of resistivities of semi-conductor material that is not proximate to intrinsic. Primarily what can be observed from the above expression is that a change in the value of any of the variable parameters in the expression will yield a control of the intrinsic alpha of the P-N hook collector junction. For example, a variation in width W of the P region 12 of collector 8 of FIGURE 3 will produce the effect in the intrinsic alpha $\alpha^*$ of raising the value. This may be seen by referring to FIGURE 5 where curve C represents the $\alpha^*$ of collector 9 of the structure of FIGURE 3 and curve D represents the $\alpha^*$ of collector 8 having a wider P region 12.

Further control of the point at which the "robbing effect" takes place and the selection of the collector which remains on when the emitter current is reduced is acquired through selection of the impedance of the individual collector circuit or of the potential of the individual collector circuit. These controls are available because the impedance in the collector circuit determines the slope of the load line defining the range of operating points on any collector characteristic curve plot and by variation of this impedance the point at which saturation occurs can be controlled and because alphas vary with collector potential. From the above description of these controls it may be seen that their use individually and in combination may be employed to produce desired effects as convenience dictates.

It will be apparent from the "robbing effect" to take place that in addition to the requirement that all collectors be within the diffusion distance for the average excess carrier during the carrier lifetime the intercollector spacing should be as follows: If the diameter of contact that the collector makes with the N region such as might occur with junction contacts is larger than the N region thickness the separation between the nearest portions of the collectors should be in the vicinity of or preferably greater than the thickness of the N region. If the collector contact diameter is smaller than the thickness of the N region such as would be encountered with point contacts then the separation of the nearest part of the collectors should be larger than the diameter of the collector contact area. The spacing between collectors must be sufficiently close for the field to interact and this should not be greater than diffusion length of the carrier lifetime. So that this distance could best be defined as sufficiently proximate so that conduction in a conducting collector is cut off by establishing conduction in an adjacent collector. Further circuit examples will be explained on the basis of changing of load resistors for simplification purposes.

What has thus far been described is a structural principle in semi-conductor device manufacture comprising a broad area junction emitter, more than one collector having an amplification factor greater than $1+b$ one of which being initially favored for conduction purposes and a base connection on a semi-conductor crystal so spaced with respect to each other so that conduction starts in one selected collector for an initial value of emitter current and can be made to switch to subsequent collectors with increments in emitter current.

Figure 6:
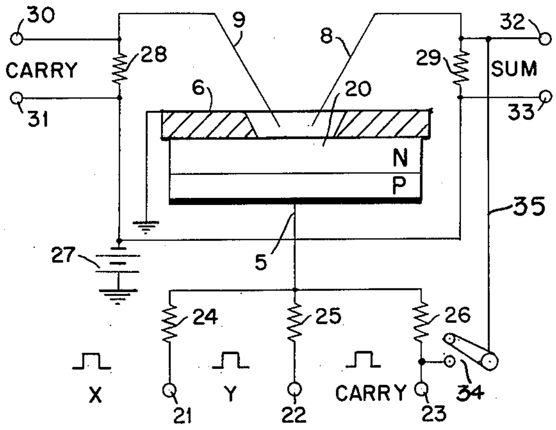
FIGURE 6 is a circuit of a single transistor full binary adder employing the principle of this invention.

The structural principle of this invention can be incorporated into a semi-conductor device which in combination with proper input and output circuitry will perform the functions of a full binary adder with gain. A full binary adder circuit is shown in FIGURE 6 wherein a transistor 20 of the type shown in FIGURE 1 or FIGURE 3 is provided. The ohmic contact 5 to the emitter is provided with three input terminals 21, 22 and 23 each coupled to the contact 5 through impedances 24, 25 and 26 of sufficient magnitude to prevent input signal interaction. It is apparent that the single junction emitter can be replaced by multiple emitters, as for example 3, all of which can be so placed that they are individually equidistant to each collector, although the respective distances to each collector may be different so that favoritism can be achieved in a like manner for each emitter. In this case, the emitter may be a point contact or any other type of injection contact so long as the injection efficiency is the same and is equal to or greater than $1/\alpha^*$ where $\alpha^*$ is the intrinsic $\alpha$ of the weakest collector. Since $\alpha^*$ of each collector must exceed $1+b$ where $b$ is mobility ratio for electron and holes in the N type region, and since $b=2$ for germanium, then $\alpha^*$ must be at least 3 and the injection efficiencies must be at least 1/3. Collectors 8 and 9 are connected to a suitable source of negative potential shown as battery 27 through load impedances of unequal magnitude shown as resistors 28 and 29. Output terminals 30 and 31 and 32 and 33 are provided across resistors 28 and 29 for purposes to be later described. Emitter input current sources are shown as positive current pulses X, Y and carry. The base connection 6 is connected to ground and collector 8 is so electroformed as to be favored for conduction and the choice of impedance value in the two collector circuits are such that collector 8 is conducting for a given value of input current and that collector 9 saturates on about two times the input current as collector 8. For purposes to be later explained a feedback connection comprising a switch 34 and a lead 35 is provided.

The term "full adder" may be applied to only three input, two output devices which is such that the first output which can be called the sum output is on when exactly one or three of the inputs are on and is otherwise off and such that the second output which can be called the carry is on when exactly two or three of the inputs are on and is otherwise off.

A logical circuit performs full binary addition when it is capable of handling inputs of two binary numbers and a carry input from a previous stage and generating either sum or carry or both signals as a result of the addition performed. In the circuit of FIGURE 6 the collector 8 can be identified as the sum collector and collector 9 can be identified as the carry collector. Each input signal has two states, zero and unit current, representing a binary 0 or 1 digit respectively. Each collector has two states of conduction namely, low or negligible conduction and high conduction. The high conduction state is used to designate a binary 1 sum or to indicate the presence of a carry signal for its respective collector. A binary 0 sum is indicated by no conduction of the sum collector.

In full adder operation the situations to be encountered are the presence or absence of binary digits labelled X and Y appearing at input terminals 21 and 22 respectively in connection with the presence or absence of a binary digit labelled "carry" from a previous stage appearing at input terminal 23. These situations produce eight possible conditions namely:

(A) The condition where X is 0, Y is 0 and carry is 0. In this case the results of the addition is 0 sum and 0 carry since no emitter input current entered the circuit through terminals 21, 22 or 23 neither collector 8 or collector 9 is in high conduction so the addition result is sum binary 0 and 0 carry.

(B) The condition where X is 1, Y is 0 and carry is 0. Here the presence of an input current pulse at terminal 21 causes high conduction in initially favored collector 8 so that the result of the binary addition of 1, 0 and 0 is sum 1 with 0 carry.

(C) The condition where X is 1, Y is 1 and carry is 0. The presence of an input current pulse at both X and Y input terminals 21 and 22 starts conduction in the sum collector 8 but the "robbing effect" takes over and switches conduction to the carry collector 9. This is shown in FIGURE 2 for the conduction $I_e=4$ MA wherein curve A represents the sum collector and curve B represents the carry collector. Hence, the result of the binary addition of 1, 1 and 0 is sum 0 and 1 carry.

(D) The condition where X is 1, Y is 1 and carry is 1. This condition results in three increments of current being introduced into the emitter through terminals 21, 22 and 23. The first increment would drive collector 8 into high conduction and then as the emitter current further increased the "robbing action" would switch the conduction to collector 9 and at this point still further emitter current, since saturation for collector 9 was selected at about twice the current of collector 8 by variation of the collector circuit load impedance 28, results in driving collector 8 again into conduction along with collector 9. This situation is shown graphically in FIGURE 2 for the condition where $I_e=6$ MA where curve A represents collector 8 and curve B represents collector 9. As a result the binary addition of 1+1+1 is sum 1 and carry 1.

(E) The condition where X is 0, Y is 1 and carry is 0 is a duplicate with respect to the operation of the adder of condition B and the result is sum 1 and carry 0.

(F) The condition where X is 0, Y is 1 and carry is 1 is a duplication of condition C and the result is sum 0 and carry 1.

(G) The condition where X is 0, Y is 0 and carry is 1 is is a duplication of condition B and the result is sum 1 and carry 0.

(H) The condition where X is 1, Y is 0 and carry is 1. This condition is identical to conditions C and F.

These conditions are set forth in the following table:

| Condition | Input | | | Result | |
|---|---|---|---|---|---|
| | X | Y | Carry | Sum | Carry |
| A | 0 | 0 | 0 | 0 | 0 |
| B | 1 | 0 | 0 | 1 | 0 |
| C | 1 | 1 | 0 | 0 | 1 |
| D | 1 | 1 | 1 | 1 | 1 |
| E | 0 | 1 | 0 | 1 | 0 |
| F | 0 | 1 | 1 | 0 | 1 |
| G | 0 | 0 | 1 | 1 | 0 |
| H | 1 | 0 | 1 | 0 | 1 |

The above described full adder performs all the addition functions for binary full addition and because of the intrinsic $\alpha^*$ of each collector, gain is provided. In order to aid in understanding and practicing this invention the following list of specific circuit values and semi-conductor specifications for the full adder of FIGURE 6 involving the transistor of FIGURE 1 are provided with the understanding that they are provided for instructional purposes only and should not be construed as limitations.

| | |
|---|---|
| Semi-conductor crystal size | 0.020 x 0.020 inch of germanium. |
| Thickness of N region 2 | 0.0009 inch. |
| Thickness of P region 3 | 0.0001 inch. |
| Resistivity of N region 2 | 5 ohm-centimeters germanium. |
| Resistivity of P region 3 | 0.01 ohm-centimeters germanium. |
| Diameter of aperture 7 | 0.003 inch. |
| Collectors 8 and 9 | 0.005 inch diameter phosphor-bronze wire with 0.00025 diameter points bearing on region 2. |
| Input impedance 24 | 10,000 ohms. |
| Input impedance 25 | 10,000 ohms. |
| Input impedance 26 | 10,000 ohms. |
| Battery 27 | −16.5 volts. |
| Load impedance 28 | 2000 ohms. |
| Load impedance 29 | 1000 ohms. |
| Input signals | +20 volt producing 2 milliamperes input current |

The above specifications produce output characteristic curves as shown in FIGURE 2 wherein curve A represents collector 8 and curve B represents collector 9.

A further understanding of the structural principle of this invention as embodied in this two collector device may be seen through a study of a number of logical circuit functions that are capable of being performed by this embodiment.

If two of the three inputs to the circuit of FIGURE 6 are considered as sources of logical signals and the third considered a signal source determining the logical function desired, this circuit is then capable of performing the logical functions of "AND," "OR," "EXCLUSIVE OR" and "IF AND ONLY IF." In what follows we are considering as logical outputs only those signals which occur after the transient precursor pulse is over.

In the "AND" function a signal is desired only if both X and Y are present.

The "AND" function is performed by the circuit of

FIGURE 6 by applying to one input a signal that is to determine the logical function desired from the circuit and by introducing the two signals to be logically compared at the remaining two terminals. In FIGURE 6 the introduction of a signal of zero input current at one terminal, for example terminal 23 will permit a logical comparison of signals introduced at terminals 21 and 22 and the result of an "AND" logical comparison will appear on collector 9.

With terminal 23 held with zero input current there are four possible conditions, of signal and no signal designated by 1 and 0 respectively. These are as follows:

(A) This is the condition where X is 1, and Y is 1, in other words a signal appears on both inputs. The first increment of input current would drive collector 8 into conduction but as the emitter drives collector 8 into saturation the "robbing action" takes place and conduction switches to collector 9 as shown in FIGURE 2 for the condition $I_e=4$ MA. Hence, the conduction in collector 9 indicates a signal at both X and Y.
(B) This is a condition where X is 1 and Y is 0. Since only one increment of emitter current appears only collector 8 conducts and no signal appears on collector 9.
(C) This is a condition where X is 0 and Y is 1. Once again the circuit receives only a single increment of emitter current and collector 9 does not receive enough current to conduct.
(D) This is a condition where X is 0 and Y is 0. In this case there is no emitter input current at all and collector 9 does not conduct.

From examination of these conditions it may be seen that collector 9 conducts only when X and Y signals are present and no conduction takes place for any other signal conditions.

Under the same set of conditions collector 8 indicates the logical function of "EXCLUSIVE OR" at the same time that collector 9 is indicating the logical function of "AND." In the "EXCLUSIVE OR" function a signal is desired if only X or Y but not both are present. No signal is desired if both X and Y are present or if neither X nor Y is present.

Considering the above conditions with respect to collector 8 we have:

(A) Since X is 1 and Y is 1 collector 9 is conducting and due to the "robbing action" collector 8 is cut-off hence no signal if both X and Y are present.
(B) Since X is 1 and Y is 0 only one increment of emitter current is introduced and collector 8 conducts indicating either X or Y but not both are present.
(C) Since X is 0 and Y is 1 once again with one increment of emitter current collector 8 conducts indicating either X or Y but not both are present.
(D) Since X is 0 and Y is 0 no emitter current is introduced and no conduction takes place in either collector. Hence with neither X nor Y no conduction takes place in collector 8.

The ability of this device to handle two complex logical functions simultaneously can be observed more in detail from the following table.

| Condition | Input | | Logical Function Selection | "EXCLUSIVE OR" Collector 8 | "AND" Collector 9 |
|---|---|---|---|---|---|
| | X | Y | | | |
| A | 1 | 1 | 0 | 0 | 1 |
| B | 1 | 0 | 0 | 1 | 0 |
| C | 0 | 1 | 0 | 1 | 0 |
| D | 0 | 0 | 0 | 0 | 0 |

A completely different set of logical functions can be handled simultaneously with this device by variation of the signal applied to one input terminal to determine logical function selection. If one increment of current is introduced constantly at one terminal in the circuit of FIGURE 6 for example terminal 23 the circuit will perform the logical functions of "OR" and "IF AND ONLY IF."

In the logical function "OR" a signal is desired if either X or Y or both X and Y is present. With one increment of input current constantly applied the result of the "OR" logical comparison will appear as conduction in collector 9. Examining once again the four possible conditions, A, B, C and D:

(A) Where X is 1 and Y is 1. Since one increment of current is already present collector 8 is conducting and the combined increments of X and Y and the function selection total three increments which drives collector 8 beyond cutoff, turns on collector 9, drives it beyond cutoff and turns on collector 8 again so that both are on. This is illustrated in FIGURE 2 for the condition $I_e=6$MA. Hence, conduction in collector 9 indicates the presence of signals at both X and Y.
(B) Here X being 1, Y being 0 results in two increments of emitter current being introduced which due to the "robbing action" turns off collector 8 and turns on collector 9.
(C) Here X being 0 and Y being 1 again two current increments are present and collector 9 conducts.
(D) Here X being 0 and Y being 0 there is no current to switch conduction to collector 9 so that no signal appears at collector 9 indicating no signal at either X or Y.

Under these conditions as described above while collector 9 indicates the logical function "OR," collector 8 indicates the function "IF AND ONLY IF" at the same time. In the logical function "IF AND ONLY IF" a signal is desired if and only if either both X and Y are present or both X and Y are not present.

(A) X is 1, Y is 1. This condition presents three increments of input current and both collectors conduct. Looking at collector 8 a signal indicates the presence of both X and Y.
(B) X is 1, Y is 0. This condition presents two increments of input current and collector 9 conducts only. Hence collector 8 has no signal.
(C) X is 0, Y is 1. This condition is a duplicate in operation of condition B. Collector 8 does not conduct.
(D) X is 0, Y is 0. This condition leaves only one increment of current which sets up conduction in collector 8 indicating the absence of both X and Y.

The following table illustrates the simultaneous performance of the "OR" and "IF AND ONLY" logical functions by the circuit of FIGURE 6.

| Condition | Input | | Logical Function Selection | "IF AND ONLY IF" C 8 | "OR" C 9 |
|---|---|---|---|---|---|
| | X | Y | | | |
| A | 1 | 1 | 1 | 1 | 1 |
| B | 1 | 0 | 1 | 0 | 1 |
| C | 0 | 1 | 1 | 0 | 1 |
| D | 0 | 0 | 1 | 1 | 0 |

Through a control of the point at which saturation of an individual collector occurs it is possible to perform two other logical functions namely "NEITHER NOR" and "NOT BOTH." The exercise of control over the point at which saturation takes place as explained above can be readily practiced by varying the load resistors of the individual collectors.

In the function NEITHER NOR a signal is desired only when neither A nor B is present. To perform this the load resistor of collector 9 is lowered and a function selection signal is applied to one terminal. This in effect permits a greater quantity of input current before saturation so that after two increments of input current are provided a further third increment will be absorbed by collector 9 and collector 8 will not again turn on. Under these conditions collector 8 will reflect the result of the logical comparison.

(A) X is 1 and Y is 1. With one increment of emitter current already applied in the form of a function selection signal the introduction of two increments makes a total of three which would cause conduction in both collectors however since the point of saturation of collector 9 has been changed this collector does not reach saturation even with three increments of current so that collector 8 remains off.
(B) X is 1, Y is 0. Here two increments are presented and conduction occurs in collector 9. Collector 8 remains off.
(C) X is 0, Y is 1. Here the operation is the same as in condition B.
(D) X is 0, Y is 0. Here the only increment of current is the logical signal which causes conduction in collector 8 indicating the absence of either X or Y.

These conditions may be seen more clearly from the following table:

| Condition | Input X | Input Y | Logical Function Selection | NEITHER NOR C 8 |
|---|---|---|---|---|
| A | 1 | 1 | 1 | 0 |
| B | 1 | 0 | 1 | 0 |
| C | 0 | 1 | 1 | 0 |
| D | 0 | 0 | 1 | 1 |

The function of "NOT BOTH" is performed by the circuit of FIGURE 6 if a function selection signal of 1 is used and the load resistor of collector 8 is lowered so that saturation in the favored collector does not take place with one increment but requires a little more than one. Since the circuit is adjusted so that collector 9 does not take over until a full unit of input current reaches it, it will not rob collector 8 until three units of input current are injected. Under these conditions the conduction in collector 8 reflects the result of the logical comparison. In the function "NOT BOTH" a signal is desired if either X or Y or neither is present but no signal is desired if both are present.

(A) X is 1, Y is 1. This presents three increments which is sufficient to switch conduction to collector 9 so that with both present collector 8 indicates no signal.
(B) X is 1, Y is 0. This presents two increments which is insufficient for switching hence collector 8 is conducting.
(C) X is 0, Y is 1. This condition is the same as B.
(D) X is 0, Y is 0. This condition presents 1 increment causing collector 8 to conduct. The following table will illustrate this.

| Condition | Input X | Input Y | Logical Function Selection | NOT BOTH C 8 |
|---|---|---|---|---|
| A | 1 | 1 | 1 | 0 |
| B | 1 | 0 | 1 | 1 |
| C | 0 | 1 | 1 | 1 |
| D | 0 | 0 | 1 | 1 |

A further logical function can be performed by the circuit of FIGURE 6 wherein the presence of an individual signal is sampled. In the "NOT" function a signal is desired if X is not present and no signal is desired if X is present. To perform this function the circuit conditions are the same as for the group of logical functions AND, OR, etc. with the exception that a steady state signal is provided at one of the three input terminals and a steady state zero is provided at a second of the three input terminals. Under these conditions the conduction in collector 8 will reflect the "NOT" condition. For this function there are two conditions.

(A) X is 1. Since one increment is present the second one sets up the "robbing action" switching conduction to collector 9. Hence for X=1 collector 8 has no signal.
(B) X is 0. Since one increment is present and no other increment is provided conduction remains in collector 8 as shown in the following table.

| Condition | Input X | Input Y | Logical Function Selection | "NOT X" C 8 | "X" C 9 |
|---|---|---|---|---|---|
| A | 1 | 0 | 1 | 0 | 1 |
| B | 0 | 0 | 1 | 1 | 0 |

As may be seen from the above examples a wide variety of logical circuit functions are possible through variation of the point at which saturation in an individual collector occurs or by variation of the magnitude of the individual input current increments. The methods of exercising control over the point at which switchinng takes place lie in three regions of the circuit. These are the variation of the input current pulse or its associated input impedance, the variation of the internal parameters of the transistor, amplification factor, etc., and the variation of the individual load circuit of the collectors. So that the variation of any one of these or combinations of them for purposes of logical circuit function performance is contemplated within the spirit of the invention.

A further example of this for instance, is the achieving of "AND" and "OR" simultaneously. This is accomplished by making the load resistors 28 and 29 equal. Now the following table holds:

| Condition | Input | | Logical Function Selection | Output | |
|---|---|---|---|---|---|
| | X | Y | | X or Y C 8 | X and Y C 9 |
| A | 0 | 0 | 0 | 0 | 0 |
| B | 1 | 0 | 0 | 1 | 0 |
| C | 0 | 1 | 0 | 1 | 0 |
| D | 1 | 1 | 0 | 1 | 1 |

(A) X and Y are both 0. Both collectors are in their normal off state.
(B) X is 1, Y is 0. Collector 8 is driven just to saturation, hence collector 8 is full on and collector 9 is off.
(C) X is 0, Y is 1. The same input conditions prevail as in condition B, that is one unit of input current, hence as in condition B collector 8 is on, collector 9 is off.
(D) X is 1, Y is 1. Collector 8 goes on and the additional unit of input current spills over into collector 9 filling it to saturation. No robbing can take place, since there is just enough input current to put both collectors into saturation.

The circuit of FIGURE 6 with slight modification can be made to perform as a memory device and as a scale of two counter. The modification necessary to permit memory is a connection from collector 8 at terminal 32 to one of the emitter input terminals for example terminal 23 such as would be accomplished by closing switch 34, and adjustment of the load resistor on collector 8 so that its switching occurs with three units. This is essential because collector 8 going on feeds an increment of current into the emitter on top of the input pulse. With this arrangement when an increment of input current is impressed on a second input terminal, for example terminal 22, the favored collector 8 goes into conduction and due to the feedback produced by connecting the output back into the input, conduction continues after the input pulse is removed. Thus the information is stored until read out or erased. Readout may be accomplished non-destructively as many times as desired by sensing conduction in collector 8 at terminals 32 and 33. Readout may also be accomplished destructively by applying an increment of input current to the emitter of sufficient magnitude to cause switching at any one of the input terminals. This increment of current along with the feedback increment due to the stored information drive collector 8 beyond saturation the "robbing action" cuts collector 8 off and switches conduction to collector 9 where the conduction is sensed as a read-out signal. At the end of the readout input pulse, collector 8 being cut off there is no feedback and all conduction in both collectors ceases. Erasure may be accomplished directly by applying a negative input current pulse at the emitter through any one of the emitter input terminals. This pulse overcomes the feedback from the stored information and cuts off conduction. Erasure may also be accomplished indirectly by introducing enough input current into the emitter to cause switching and cut off the feedback as was described in connection with destructive read-out above. A second type of controllable memory is achieved with the effect that the emitter current being subsequently reduced after conduction has been established in the second collector the conduction is retained in the second collector. The circuit of FIGURE 6 when supplied with one steady increment of input current and constructed so that collectors 8 and 9 perform as in curves B and C respectively of FIGURE 4 will remember the occurrence of an input pulse. The steady increment turns on collector 8 and the pulse to be remembered switches conduction to collector 9 where it is retained by the continued conduction of collector 9 after the pulse is removed and the absence of conduction of collector 8. Hence there are two indications of the memory, both collectors 8 and 9. Erasure is accomplished by removing the steady state increment momentarily. It should be noted that this positive feedback as shown for memory purposes will permit this circuit for selected parameter values to exhibit negative resistance such as may be employed in oscillators.

Similarly, as may be seen from the destructive readout described above an output signal on collector 9 is received for every other input pulse. This is in effect a scale of two counter. It should be noted that this particular counter is merely an illustrative example and that employment of the structural principle of this invention, namely, construction of a semi-conductor device having multiple collectors and an inter-electrode spacing relationship such that conduction switches from a predetermined first collector to subsequent collectors with increments of emitter current, can readily be projected by one skilled in the art to more complicated counters of greater than a scale of two.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed:

1. A semi-conductor device comprising a body of semi-conductor material, a junction emitter to said body, an ohmic base connection to said body and at least two high amplification factor collectors one of which is favored for low emitter currents, the spacing from said emitter to each of said collectors being within the diffusion distance of the average excess carrier during the carrier lifetime of said semi-conductor body and the spacing between each of said collectors and the nearest adjacent collector being such that conduction in said nearest adjacent collector, at a time when one of said collectors is in conduction, is operable to cut off conduction in said one collector.

2. A semi-conductor device comprising a body of semi-conductor material, a junction emitter to said body, an ohmic base connection to said body and first and second high amplification factor collectors, said first collector being favored for low emitter currents the spacing from said emitter to each of said collectors being within the diffusion distance of the average excess carrier during the carrier lifetime of said semi-conductor body and the spacing between said first and said second collector being such that conduction in said first collector can be cut off by establishing conduction in said second collector.

3. A semi-conductor device comprising a semi-conductor body, a junction emitter to said body, an ohmic base contact to said body, a first high amplification factor collector on said body spaced from said emitter a distance within the diffusion length for the average excess carrier during the carrier lifetime of said body and a second high amplification factor collector on said body spaced from said emitter a distance within the diffusion length of the average excess carrier during the carrier lifetime of said body, said second collector being further spaced as to be sufficiently proximate to said first collector as to enable cutting off conduction in said first collector by establishing conduction in said second collector.

4. A semi-conductor device comprising a semi-conductor body of one type conductivity including first and second parallel surfaces spaced from each other a distance within the diffusion length of the average excess carrier during the carrier lifetime of the semi-conductor material, a junction emitter including a region of opposite type conductivity to said semi-conductor body forming a junction barrier with said semi-conductor body at said first surface, an ohmic base connection to said body covering substantially all of said second surface, an aperture in said ohmic base contact, a first high amplification factor collector making contact with said body in said aperture spaced from said base contact and a second high amplification factor collector making contact with said body in said aperture spaced from said base contact, said second collector being further spaced from said first collector so that said first collector is cut off by establishing conduction in said second collector.

5. The semi-conductor device of claim 3 wherein said high amplification factor collectors are electroformed point contacts.

6. The semi-conductor device of claim 3 wherein said high amplification factor collectors are P-N hook junction collectors.

7. The semi-conductor device of claim 3 wherein said first and second surfaces are slightly divergent.

8. The semi-conductor device of claim 7 wherein said collectors are electroformed point contacts.

9. The semi-conductor device of claim 7 wherein said collectors are P-N hook junction collectors.

10. A semi-conductor circuit comprising in combination a semi-conductor device including a body of semi-conductor material, a junction emitter to said body, an ohmic base connection to said body and first and second high amplification factor collectors, said first collector being favored for low emitter currents, spacing from said emitter to each of said collectors being within the diffusion distance of the average excess carrier during the carrier lifetime of said semi-conductor body and spacing between said first and said second collector being such that conduction in said first collector can be cut off by establishing conduction in said second collector, a point of reference potential, a source of appropriate polarity power having one terminal connected to said point reference potential, a first load impedance, means connecting a first terminal of said first load impedance to the remaining terminal of said power source, means connecting the remaining terminal of said first load impedance to said first collector, a second load impedance, means connecting a first terminal of said second load impedance to said second collector, means connecting the remaining terminal of said second load impedance to said remaining terminal of said power source, means connecting said base connection to said point reference potential and input means for introducing at least three separate sources of input current to said body.

11. The circuit of claim 10 where said input means includes further means for preventing interaction between input current signals.

12. A semi-conductor device comprising in combination a semi-conductor body including two regions of N and P type conductivity respectively separated by a junction barrier, said N type region having a thickness between a first surface and said junction barrier within the diffusion distance for the average excess carrier during the carrier lifetime of said N type region, said N and P type regions having a ratio of resistivities of N to P type of at least 5 to 1, an ohmic connection to said P region, an ohmic base connection covering substantially all of said first surface of said N type region, an aperture in said ohmic base connection exposing a portion of said first surface of said N type region, a first favored electroformed point contact collector making contact with said N region in said aperture, a second electroformed point contact collector making contact with said N region in said aperture and spaced from said first collector sufficiently proximate that conduction in said first collector is cut off by establishing conduction in said second collector.

13. A semi-conductor device comprising in combination a semi-conductor body including two regions of P and N type conductivity respectively separated by a junction barrier, said P region having a thickness between a first surface and said junction barrier within the diffusion distance for the average excess carrier during the carrier lifetime of said P type region, said P and N type regions having a ratio of resistivities of P and N type of at least 5 to 1, an ohmic connection to said N region, an ohmic base connection covering substantially all of said first surface of said P type region, an aperture in said ohmic base connection exposing a portion of said first surface of said P type region, a first favored electroformed point contact collector making contact with said P region in said aperture, a second electroformed point contact collector making contact with said P region in said aperture and spaced from said first collector sufficiently proximate that conduction in said first collector is cut off by establishing conduction in said second collector.

14. A semi-conductor circuit comprising in combination a semi-conductor device including two regions of N and P type conductivity respectively separated by a junction barrier, said N type region having a thickness between a first surface and said junction barrier within the diffusion distance for the average excess carrier during the carrier lifetime of said N type region, said N and P type regions having a ratio of resistivities of N to P type of at least 5 to 1, an ohmic connection to said P region, an ohmic base connection covering substantially all of said first surface of said N type region, an aperture in said ohmic base connection exposing a portion of said first surface of said N type region, a first favored electroformed point contact collector making contact with said N region in said aperture, a second electroformed point contact collector making contact with said N region in said aperture and spaced from said first collector sufficiently proximate that conduction in said first collector is cut off by establishing conduction in said second collector, a point of reference potential, means connecting said base connection to said point of reference potential, a source of negative potential, a first load impedance, means connecting said source of negative potential to said first collector through said first load impedance, a second load impedance, means connecting said source of negative potential to said second collector through said second load impedance, and input means for introducing three separate input current signals to said P region.

15. A semi-conductor circuit comprising in combination a semi-conductor device including two regions of P and N type conductivity respectively separated by a junction barrier, said P type region having a thickness between a first surface and said junction barrier within the diffusion distance for the average excess carrier during the carrier lifetime of said P type region, said P and N type regions having a ratio of resistivities of P to N type of at least 5 to 1, an ohmic connection to said N region, an ohmic base connection covering substantially all of said first surface of said P type region, an aperture in said ohmic base connection exposing a portion of said first surface of said P type region, a first favored electroformed point contact collector making contact with said P region in said aperture, a second electroformed point contact collector making contact with said P region in said aperture and spaced from said first collector sufficiently proximate that conduction in said first collector is cut off by establishing conduction in said second collector, a point of reference potential, means connecting said base connection to said point of reference potential, a source of positive potential, a first load impedance means connecting said source of positive potential to said first collector through said first load impedance, a second load impedance, means connecting said source of positive potential to said second collector through said second load impedance, and input means for introducing three separate input current signals to said N region.

16. The semi-conductor circuit of claim 14 wherein said source of negative potential comprises two sources of negative potential, one source being for each collector.

17. The circuit of claim 14 including a connection from the point of connection of said first load impedance to said first collector to said input means.

18. The semi-conductor circuit of claim 14 wherein said input means includes further means for preventing interaction between said three input current signals.

19. In an electrical circuit wherein binary inputs to be added and binary outputs representing the binary sum and binary carry of the addition, said inputs and outputs being of like polarity, a binary full adder including, a semi-conductor device comprising a semi-conductor body, a junction emitter to said body, an ohmic base contact to said body, a first high amplification factor collector on said body spaced from said emitter a distance within the diffusion length for the average excess carrier during the carrier lifetime of said body and a second high amplification factor collector on said body spaced from said emitter a distance within the diffusion length of the average excess carrier during the carrier lifetime of said body, said second collector being further spaced as to be sufficiently proximate to said first collector as to enable cutting off conduction in said first collector by establishing conduction in said second collector, means coupled to said junction emitter for receiving said inputs, a sum output terminal connected to said first collector to exhibit said binary sum, and a carry output terminal connected to said second collector to exhibit said binary carry.

20. In an electrical circuit wherein binary inputs to be added and binary outputs representing the binary sum and binary carry of the addition, said inputs and outputs being of like polarity, a binary full adder including, a semi-conductor device comprising a body of semi-conductor material, a junction emitter to said body, an ohmic base connection to said body and first and second high amplification factor collectors, said first collector being favored for low emitter currents, the spacing from said emitter to each of said collectors being within the diffusion distance of the average excess carrier during the carrier lifetime of said semi-conductor body and the spacing between said first and said second collector being such that conduction in said first collector can be cut off by establishing conduction in said second collector, means coupled to said junction emitter for receiving said inputs, a sum output terminal connected to said first collector to exhibit said binary sum, and a carry output terminal connected to said second collector to exhibit said binary carry.

21. In an electrical circuit having more than one stable state a semi-conductor device comprising a body of semi-conductor material, a junction emitter to said body, an ohmic base connection to said body and first and second high amplification factor collectors, said first collector being favored for low emitter currents, the spacing from said emitter to each of said collectors being within the diffusion distance of the average excess carrier during the carrier lifetime of said semi-conductor body and the spacing between said first and said second collector being such that conduction in said first collector can be cut off by establishing conduction in said second collector, a power source having a first terminal thereof connected to reference potential, first load means, means connecting said first load means between a second terminal of said power source and said first collector, second load means, means connecting said second load means between said second terminal of said power source and said second collector, feedback means connected between said first collector and said emitter connection and means connecting said base connection to said reference potential.

22. A semi-conductor bistable circuit comprising in combination a semi-conductor device comprising a body of semi-conductor material, a junction emitter to said body, an ohmic base connection to said body and first and second high amplification factor collectors, said first collector being favored for low emitter currents, the spacing from said emitter to each of said collectors being within the diffusion distance of the average excess carrier during the carrier lifetime of said semi-conductor body and the spacing between said first and said second collector being such that conduction in said first collector can be cut off by establishing conduction in said second collector, a source of appropriate polarity power having a first terminal thereof connected to reference potential, a first load means connected between a second terminal of said power source and said first collector and having a magnitude such that said first collector is approaching saturation when conducting, a second load means connected between said second terminal on said power source and said second collector, means for introducing input signals to said emitter, feedback means connected between said first collector and said emitter and means connecting said base connection to said reference potential.

23. A semi-conductor circuit element comprising in combination on a monocrystalline semi-conductor body a broad area input electrode, a control electrode, at least two output electrodes and means internal to said semi-conductor body operable to terminate an output signal at one electrode with the initiation of an output signal at a subsequent electrode.

References Cited in the file of this patent

UNITED STATES PATENTS

| | | |
|---|---|---|
| 2,524,033 | Bardeen | Oct. 3, 1950 |
| 2,553,490 | Wallace | May 15, 1951 |
| 2,586,080 | Pfann | Feb. 19, 1952 |
| 2,636,985 | Weissman | Apr. 28, 1953 |
| 2,663,806 | Darlington | Dec. 22, 1953 |
| 2,672,528 | Shockley | Mar. 16, 1954 |
| 2,748,041 | Leverenz | May 29, 1956 |
| 2,778,956 | Dacey et al. | Jan. 22, 1957 |
| 2,778,980 | Hall | Jan. 22, 1957 |
| 2,790,037 | Shockley | Apr. 23, 1957 |
| 2,816,228 | Johnson | Dec. 10, 1957 |
| 2,820,154 | Kurshan | Jan. 14, 1958 |
| 2,895,673 | Williams | July 21, 1959 |
| 2,915,646 | Kurshan | Dec. 1, 1959 |
| 2,971,696 | Henle | Feb. 14, 1961 |

FOREIGN PATENTS

| | | |
|---|---|---|
| 739,294 | Great Britain | Oct. 26, 1955 |

OTHER REFERENCES

Transistor Electronics by Lo et al., copyright 1955 by Prentice-Hall, Inc., pages 29, 30.